(12) United States Patent
Pita

(10) Patent No.: US 9,378,311 B2
(45) Date of Patent: *Jun. 28, 2016

(54) MULTI-LEVEL SOLUTION OF LARGE-SCALE LINEAR SYSTEMS IN SIMULATION OF POROUS MEDIA IN GIANT RESERVOIRS

(71) Applicant: Saudi Arabian Oil Company, Dhahran (SA)

(72) Inventor: Jorge A. Pita, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 619 days.

This patent is subject to a terminal disclaimer.

(21) Appl. No.: 13/763,153

(22) Filed: Feb. 8, 2013

(65) Prior Publication Data

US 2013/0226540 A1    Aug. 29, 2013

Related U.S. Application Data

(60) Provisional application No. 61/596,948, filed on Feb. 9, 2012.

(51) Int. Cl.
| | |
|---|---|
| G06F 7/60 | (2006.01) |
| G06F 17/10 | (2006.01) |
| G06F 17/50 | (2006.01) |
| G01V 99/00 | (2009.01) |

(52) U.S. Cl.
CPC .......... *G06F 17/5009* (2013.01); *G01V 99/00* (2013.01); *G06F 17/5018* (2013.01)

(58) Field of Classification Search
CPC .......... G06F 17/5018; G06F 17/5036; G06F 17/5009; G06F 17/02; G06F 2217/16; G01V 99/00
USPC .......................................................... 703/2
See application file for complete search history.

(56) References Cited

U.S. PATENT DOCUMENTS

| | | | |
|---|---|---|---|
| 7,349,833 B2 | 3/2008 | Yu | |
| 2006/0235667 A1 | 10/2006 | Fung et al. | |
| 2008/0167849 A1* | 7/2008 | Hales | G01N 33/28 703/10 |
| 2010/0094605 A1 | 4/2010 | Hajibeygi et al. | |
| 2011/0191080 A1 | 8/2011 | Klie | |

OTHER PUBLICATIONS

International Search Report and Written Opinion issued in related PCT Application No. PCT/US2013/025280; dated Jun. 17, 2013; 17 pages.
Saad, Y., "Iterative Methods for Sparse Linear Systems", Iterative Methods for Sparse Linear Systems; Jan. 1, 1996; pp. IV-XI.

(Continued)

*Primary Examiner* — Saif Alhija
(74) *Attorney, Agent, or Firm* — Bracewell LLP; Constance G. Rhebergen; Albert B. Kimball, Jr.

(57) ABSTRACT

In solving linear systems of billions of equations resulting from reservoir simulator pressure equations for giant reservoirs organized into fine-grid models, a multi-level methodology acquires a fast and coarser grid solution to be used as a more accurate initial estimate for the fine grid problem. Solver iterations performed on the coarser grid in reduced processing time generate a better initial estimate, resulting in fewer of the more expensive iterations at the fine-grid level.

30 Claims, 9 Drawing Sheets

(56) References Cited

OTHER PUBLICATIONS

K-M. M., Li, "A Linear Equation Solver for Massively Parallel Computers", 12th SPE Symposium on Reservoir Simulation; Feb. 28-Mar. 4, 1993; pp. 83-88; SPE 25241.

Chien et al., "A Scalable Parallel Multi-Purpose Reservoir Simulator", SPE Reservoir Simulation Symposium, Jun. 8-11, 1997, pp. 17-30, SPE 37976.

K-M.G. Li, "A Linear Equation Solver for Massively Parallel Computers", 12th SPE Symposium on Reservoir Simulation, Feb. 28-Mar. 3, 1993, pp. 83-88, SPE 25241.

Dogru et al., "A Parallel Reservoir Simulator for Large-Scale Reservoir Simulation", SPE Reservoir Simulation Symposium, Feb. 14-17, 1999, pp. 11-23, SPE 75805.

Dogru et al., "A Massively Parallel Reservoir Simulator for Large Scale Reservoir Simulation", SPE Reservoir Simulation Symposium, Feb. 14-17, 1999, pp. 1-28, SPE 51886.

J.E. Dendy Jr. et al., "Multigrid Methods for Three-Dimensional Petroleum Reservoir Simulation", Society of Petroleum Engineer, Feb. 6-8, 1989, pp. 19-25, Houston USA, SPE18409.

Klaus Stuben, "A Review of Algebraic Multigrid", (SCAI) (GMD), Nov. 9, 1999, pp. 1-36, St. Augustin Germany.

Yousef Saad, "Krylov Subspace Methods Part 1", Iterative Methods for Sparse Linear Systems, (2000), pp. 158-168.

Yousef Saad, "Krylov Subspace Methods Part 2", Iterative Methods for Sparse Linear Systems, (2000), pp. 210-221.

Stephen F. McCormick, "Multilevel Adaptive Methods for Partial Differential Equations", Society for Industrial and Applied Mathematics, Library of Congress Card Catalog No. E9-22034.

* cited by examiner

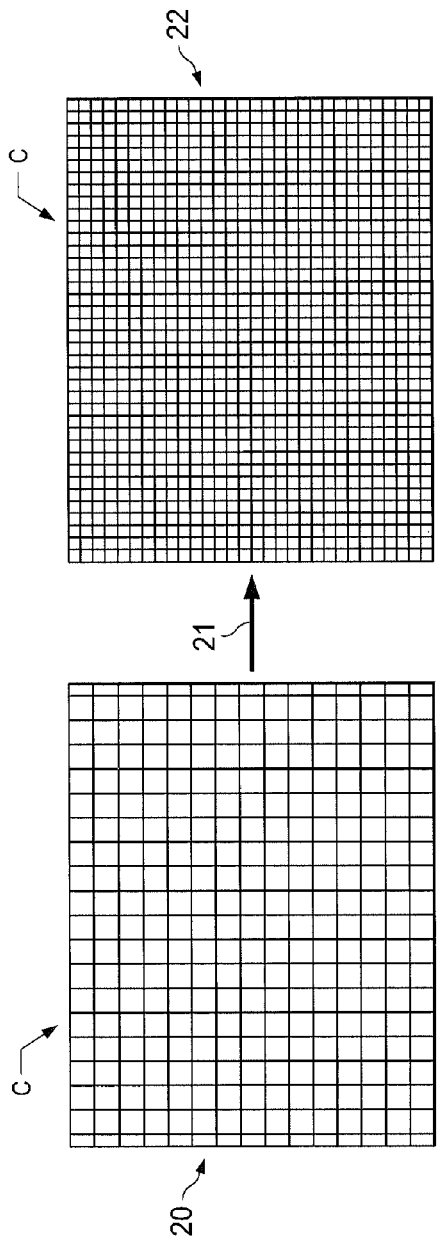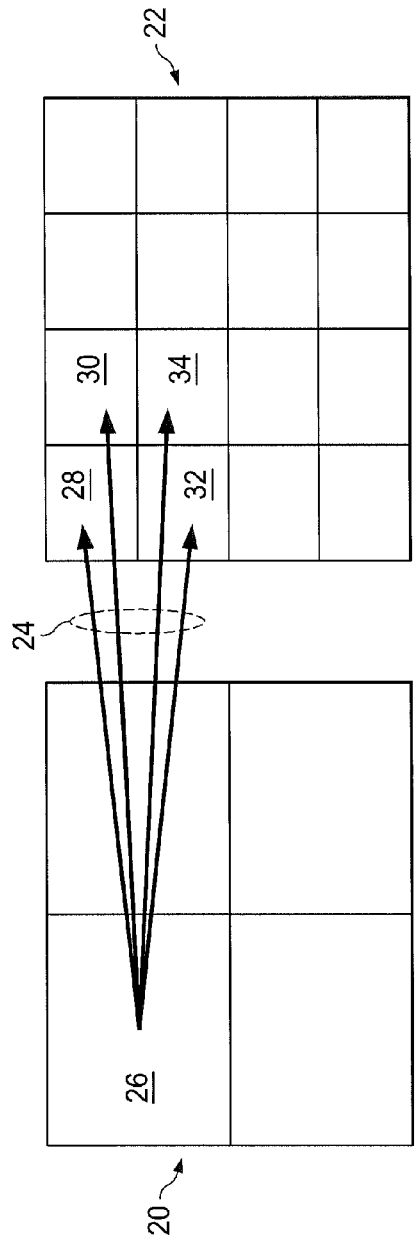

| $d_1$ | $b_1$ |  |  |  | $e_1$ | $s_1$ |  |  |
|---|---|---|---|---|---|---|---|---|
| $a_3$ | $d_3$ | $b_3$ |  |  | $w_3$ |  | $s_3$ |  |
|  | $a_5$ | $d_5$ | $b_5$ |  | $n_5$ | $w_5$ | $e_5$ | $s_5$ |
|  |  | $a_7$ | $d_7$ | $b_7$ |  | $n_7$ |  | $e_7$ |
|  |  |  | $a_9$ | $d_9$ |  |  | $n_9$ | $w_9$ |
| $w_2$ | $e_2$ | $s_2$ |  |  | $d_2$ | $b_2$ |  |  |
| $n_4$ |  | $e_4$ | $s_4$ |  | $a_4$ | $d_4$ | $b_4$ |  |
|  | $n_6$ | $w_6$ |  | $s_6$ |  | $a_6$ | $d_6$ | $b_6$ |
|  |  | $n_8$ | $w_8$ | $e_8$ |  |  | $a_8$ | $d_8$ |

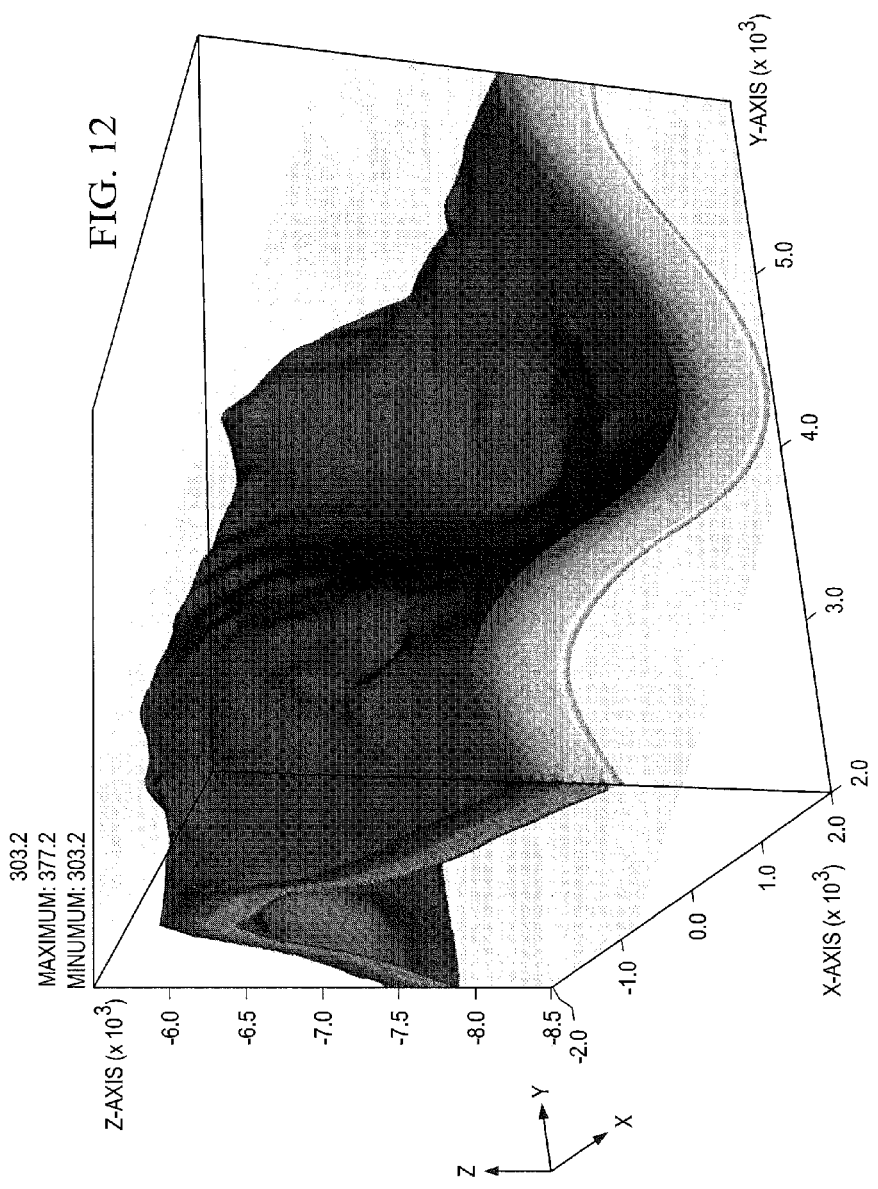

MULTI-LEVEL SOLUTION OF LARGE-SCALE LINEAR SYSTEMS IN SIMULATION OF POROUS MEDIA IN GIANT RESERVOIRS

CROSS REFERENCE TO RELATED APPLICATIONS

This application claims priority from U.S. Provisional Application No. 61/596,948, filed Feb. 9, 2012. For purposes of United States patent practice, this application incorporates the contents of the Provisional Application by reference in entirety.

BACKGROUND OF THE INVENTION

1. Field of the Invention

The present invention relates to computer simulation of what are known as giant reservoirs, and more particularly to multi-level solution of large-scale linear systems during simulation of single phase fluid in oil reservoirs and compressible single phase dry gas reservoirs.

2. Description of the Related Art

U.S. Pat. No. 7,526,418, of which Applicant is named as an inventor, and which is of common ownership to the present invention, is a compositional reservoir simulator which performed simulations in shared memory supercomputers, distributed memory supercomputers or clusters of personal computers (PC's) configured as computer data processing units (CPU's). Other reservoir simulation efforts using CPU's are U.S. Pat. Nos. 7,516,056 and 7,684,967.

The linear solution of the pressure equation or temperature equation for the giant systems of equations composed of fine-grid models (seismic-scale 12.5 meter to 25 meter) can represent 50% or more of the total simulation time for reservoir and basin simulations of subsurface geological formations. The linear solver determines the "correction" required for the Newton iteration to converge to the solution of the underlying non-linear system of partial differential equations which define fluid flow, material balance and pressure-volume-temperature conditions of reservoir fluids at a series of time steps. For what are known as giant reservoirs, the number of cells can be millions or even a billion or more. The linear solver process was thus computationally intensive and time consuming.

Even present petascale-capable computing systems, which are systems capable of one quadrillion calculations per second, and are composed of tens of thousands of processors, cannot efficiently solve these systems of equations if inaccurate initial guesses are used for a simulation model which is on a fine grid model. Many expensive linear iterations by the computing systems are wasted in seeking reasonable solution directions based on inaccurate initial guesses.

SUMMARY OF THE INVENTION

Briefly, the present invention provides a new and improved method of computerized simulation of a giant subsurface reservoir in a data processing system of a plurality of data processors. The computerized simulation is an iterative linear solution of equations for reservoir parameters of a giant subsurface reservoir, with the giant subsurface reservoir being simulated as a model partitioned into a number of cells arranged in an organized system of cells. The simulation is further based on geological and fluid characterization information for the cells of the reservoir. The method according to the present invention includes the computer processing steps of mapping information from the organized system of cells of the reservoir from an original fine grid scale into a coarse cell grid of a reduced number from the original grid, and initializing a postulated system solution matrix in the computer system for reservoir parameters for the coarse cell grid. The method according to the present invention further includes the computer processing steps of performing a preconditioned conjugate-gradient extrapolation in the computer system on the initialized postulated system solution matrix received for reservoir parameters for the coarse cell grid, transforming in the computer system the results of the preconditioned conjugate-gradient extrapolation for the coarse cell grid to the original cell grid, and performing an iterative linear solution in the computer system for reservoir parameters for the original grid of cells.

The present invention further provides a new and improved data processing system for computerized simulation of a giant subsurface reservoir in a computer system. The computerized simulation is an iterative linear solution of equations for reservoir parameters of a giant subsurface reservoir, and the giant subsurface reservoir being simulated as a model is partitioned into a number of cells arranged in an organized system of cells. The simulation is further based on geological and fluid characterization information for the cells of the reservoir. The data processing system according to the present invention comprises a plurality of data processors, each performing in parallel the steps of: mapping information from the organized system of cells of the reservoir from an original fine grid scale into a coarse cell grid of a reduced number from the original grid; initializing a postulated system solution matrix in the computer system for reservoir parameters for the coarse cell grid; performing a preconditioned conjugate-gradient extrapolation in the computer system on the initialized postulated system solution matrix received for reservoir parameters for the coarse cell grid; transforming the results of the preconditioned conjugate-gradient extrapolation for the coarse cell grid to the original cell grid; and performing an iterative linear solution in the computer system for reservoir parameters for the original grid of cells. The data processing system further includes a memory for storing the determined reservoir parameters of the original grid of cells.

The present invention also provides a new and improved data storage device having stored in a computer readable medium computer operable instructions for causing a data processing system comprising a plurality of data processors, while computerized simulation computerized simulation of a giant subsurface reservoir of a giant subsurface reservoir, to operate in accordance with a set of computer operable instructions stored in the data storage device. The giant subsurface reservoir being simulated as a model is partitioned into a number of cells arranged in an organized system of cells. The simulation is made by iterative linear solution of equations for reservoir parameters and further is based on geological and fluid characterization information for the cells of the reservoir. The computer operable instructions stored in the data storage device cause the data processing system to perform the following steps: mapping information from the organized system of cells of the reservoir from an original fine grid scale into a coarse cell grid of a reduced number from the original grid; initializing a postulated system solution matrix in the computer system for reservoir parameters for the coarse cell grid; performing a preconditioned conjugate-gradient extrapolation in the computer system on the initialized postulated system solution matrix received for reservoir parameters for the coarse cell grid; transforming in the computer system the results of the preconditioned conjugate-gradient extrapolation for the coarse cell grid to the original cell grid; and performing an iterative linear solution in the computer system for reservoir parameters for the original grid of cells.

BRIEF DESCRIPTION OF THE DRAWINGS

FIGS. 2A and 2B are enlarged schematic diagrams of a group of different sized adjacent cells from the hydrocarbon reservoir model of FIG. 1.

FIGS. 3A and 3B are schematic diagrams of interpolation of initial solutions obtained from a coarse grid model into a fine grid model of the reservoir shown in FIG. 1.

FIG. 12 is an isometric view of an image of a model of an actual reservoir for which data were processed according to the present invention.

DETAILED DESCRIPTION OF THE PREFERRED EMBODIMENTS

Figure 1:
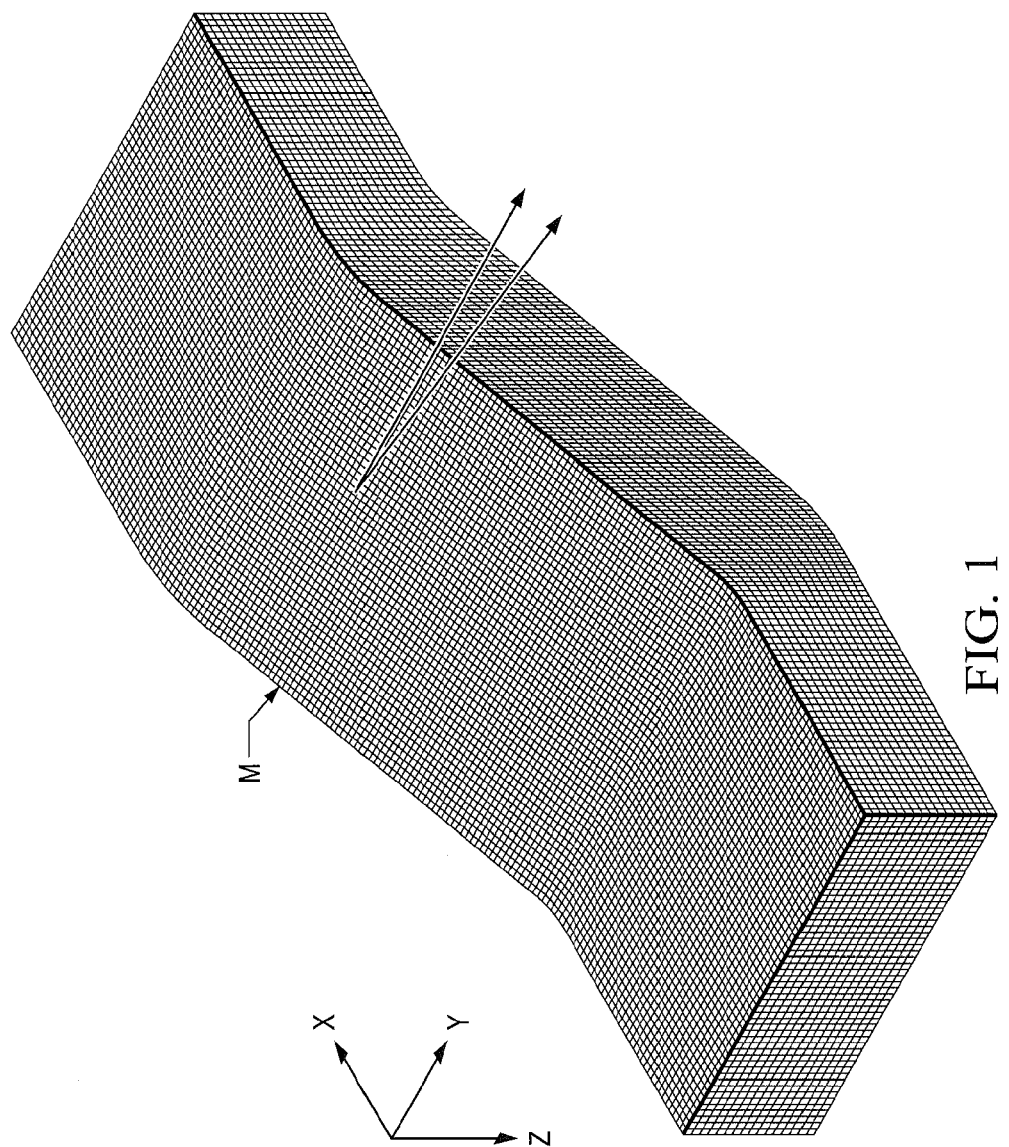
FIG. 1 is an isometric view of a compositional model of a giant subterranean hydrocarbon reservoir organized into a number of cells.

In the drawings, the letter M designates a simplified model of a portion of a subsurface hydrocarbon reservoir for which production results based on operating conditions and parameters are simulated over an estimated production life according to the present invention based on geological and fluid characterization information obtained for the cells of the reservoir. The results obtained are thus available and used for simulation of historical performance and for forecasting of production from the reservoir. Based on the results of such simulation, models such as those described and shown in U.S. Pat. No. 7,526,418 are then formed and are available for evaluation and analysis. U.S. Pat. No. 7,526,418 is owned by the assignee of the present invention and is incorporated herein by reference An example reservoir of the type for which production data are simulated over the expected reservoir life as illustrated by the model M is usually one which is known to those in the art as a giant reservoir. A giant reservoir may be several miles in length, breadth and depth in its extent beneath the earth and might, for example, have a volume or size on the order of three hundred billion cubic feet.

The model M is partitioned into a number of cells C of suitable dimensions, several adjacent ones of which are depicted in FIGS. 2A and 2B in enlarged form and scale from FIG. 1. In partitioning the volume of the reservoir into units at what is known as seismic-scale for analytical purposes, typical cells for what is known as a coarse grid 20 in FIG. 2A are each 160 or so feet. It should be understood that 200 meter and 100-meter cells are also common as a "coarse" grid model along their lateral or areal dimensions in a common plane of reference in the reservoir. In what are known as fine grid models of the type shown at 22 in FIG. 2B, a typical cell can be fifteen to twenty or less feet along its lateral or areal dimensions. For example, when the coarse grid is 100-meters and the fine grid target model is 25 meters, two levels of multi-grid simulation can be used: the first level using 100 meters and the second level using 50 meters, in a manner to be described.

The model M of FIG. 1 thus represents a reservoir composed of a million or more cells having dimensions described above. As noted, in the case of seismic scale data the number of cells can be hundreds or more times larger than this. It will be appreciated that the cells C shown in the drawings as forming the model M are considerably enlarged for illustrative purposes in comparison with the model M. Further information about models of this size and complexity is set forth in previously mentioned, incorporated by reference U.S. Pat. No. 7,526,418.

The present invention provides a fast multi-level methodology for the solution of billions of equations for single phase flow models for porous media. In the embodiment described herein, the single phase flow may be of a slightly compressible single phase fluid oil reservoir, or a compressible single phase gas reservoir. The methodology of the present invention may be practiced in heterogeneous computing systems of the type shown as data processing system D in FIG. 4A with many CPU's and acceleration devices. The methodology of the present invention may also be practiced in what is known as a supercomputer S shown in FIG. 4B, such as the IBM Blue Gene® supercomputer, a present version of which is known as the Blue Gene/P. The present invention has been tested on large computer systems with up to 65,536 processor cores, and provides three times or more acceleration in the solution time compared to existing approaches. Since linear solution of the single phase flow system can account for significant portions of the total simulation time, the overall simulation savings are substantial.

As will be set forth, the multi-level approach according to the present invention obtains an inexpensive but accurate initial estimate or guess of the solution space by solving the system on a coarser grid, such as that shown at 20 in FIG. 2A. The initial estimate or guess obtained from the coarser grid is refined as indicated schematically by an arrow 21 to the finer geological-scale grid such as 22 in FIG. 2B, and, being a more accurate estimate, results in fewer iterations required on the fine-grid model. This methodology avoids the increased expense in processing time caused by each iteration of the fine grid model being several times more expensive than those on the coarser model.

The present invention provides robust preconditioners and conjugate-gradient accelerators for the multi-level system. The present invention also provides fast and parallelizable interpolation methodology that can quickly refine coarse grid solutions into the fine grid, even if the computational hardware is composed of tens of thousands of computational cores. As will be set forth, results computed on a 65,536-core IBM Blue Gene/P supercomputer indicate that faster solution times of three times or more are achieved by the present invention.

Iterative Linear Solution

The present invention provides a petascale parallel process for solving the general linear system Ax=R where A is the system matrix (typically the Jacobian of the nonlinear system of equations being solved), x is the vector of system solutions and R is the vector of right-hand-sides of the linear system. In reservoir simulation and basin modeling, this system arises repeatedly during nonlinear iteration of the conservation equations via Newton's method.

In Newton's method, the Jacobian matrix (J), the nonlinear residuals (F) and the nonlinear iteration updates of the variables (s) are related by the equation Js=−F. So comparing with the canonical linear system Ax=R mentioned above, A represents the Jacobian "J", x represents the solution updates "s" and R represents the nonlinear residual right-hand-side "−F" (with negative sign to make the Newton updates directly additive to the current variable state).

The methodology of the present invention is based on the discovery that, in developing a cheaper way to generate accurate initial estimates or guesses to the solution of the linear system of equations arising from Jacobian linearizations, the number of iterations required on fine-grid systems of multi-billion-equations could be greatly reduced, with substantial savings in computer time. The present invention builds a coarser representation of the problem by direct decimation or interpolation of the fine grid into a coarser one. This smaller linear system is then used to iterate towards a solution of the linear system. After the coarse grid initial solution is obtained, the present invention then interpolates this solution into the fine grid, so that the fine-grid now has a better initial guess from which fewer iterations will be required to converge (an iteration in the fine grid being much more expensive than an iteration on the coarse grid).

The initial coarse grid solution becomes the initial estimate guess for an associated or related number of grids of the fine-grid system, so that solution of the linear system for the fine grids may converge in only a few iterations, since the solution starting point is expected to be closer to the true fine-grid solution. This strategy is illustrated conceptually in FIGS. 3A and 3B, where a set of arrows 24 extending from a coarse grid cell 26 of coarse grid model 20 indicates schematically transition of the initial solution according to the present invention to an associated or related number of fine grid cells 28, 30, 32, and 34 of the fine grid model 22.

For the purpose of obtaining the initial solution in the coarse grid model 20, initial mapping of the fine-grid properties from fine grid model 22 into the coarser grid 20 is performed. In this embodiment, the fine-grid properties are pressure and compositions for reservoir above the bubble point pressure obeying essentially a single phase behavior. The initial mapping can be performed by a variety of techniques in different embodiments of this invention. Bi-linear interpolation has been found the most effective at moderate cost in processing time.

Once the coarse-grid solution has been obtained, re-mapping into the fine grid 36 shown schematically in FIG. 3B can be accomplished also by bi-linear interpolation, or by the cheaper but less accurate method of direct injection. In direct injection, a single coarse-cell value for a cell such as 24 is directly replicated into all four cells 28, 30, 32 and 34 of the finer 22 as illustrated in FIGS. 2A and 2B. The use of bi-linear interpolation is recommended for very heterogeneous models, while direct injection can be advantageous (i.e., faster) in models with smoothly continuous property variation.

Figure 4A:
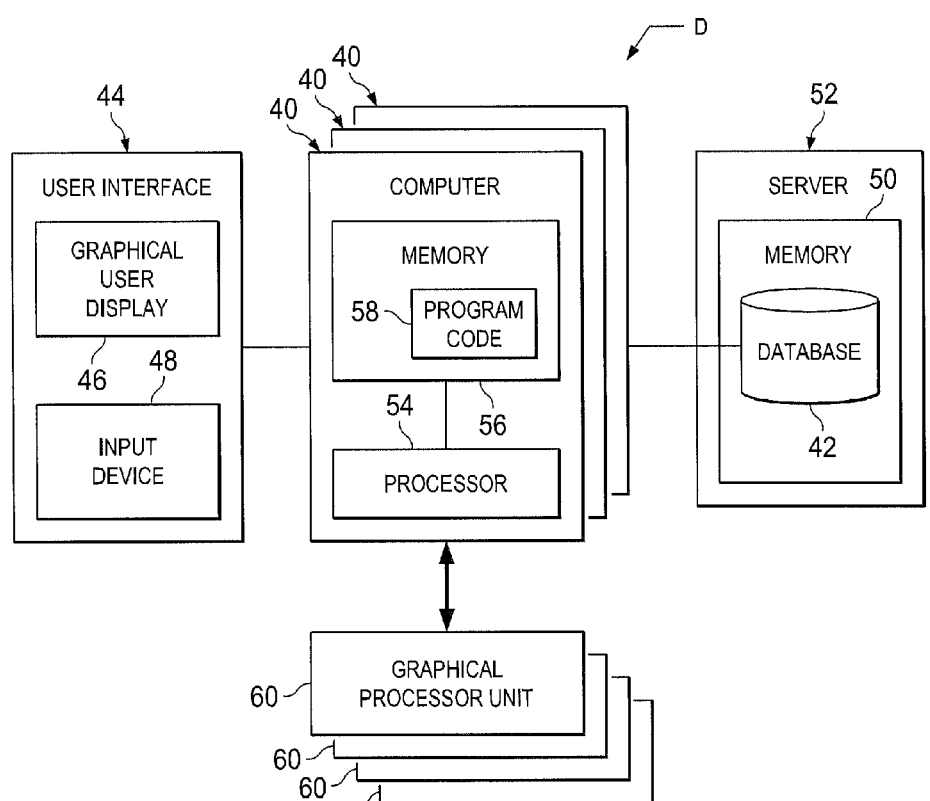
FIG. 4A is a schematic diagram of a heterogeneous computer system organized for reservoir simulation according to the present invention.

Considering now a heterogeneous computer or data processing system according to the present invention, as illustrated in FIG. 4A, the data processing system D is provided for computerized simulation of fluid motion between the grid blocks in the model M of the reservoir at each Newton iteration of every time step of interest. The data processing system P includes one or more central processing units or CPU's 40. The CPU or CPU's 40 have associated therewith a reservoir memory or database 42 for reservoir cell geological and fluid characterization information and a user interface 44. The user interface 44 includes a graphical display 46 for displaying graphical images, a printer or other suitable image forming mechanism and a user input device 48 to provide a user access to manipulate, access and provide output forms of processing results, database records and other information.

The reservoir memory or database 42 is typically in a memory 50 of an external data storage computer 52. The insertion database 42 contains data including the structure, location and organization of the cells in the model M, and data regarding wells, processing facilities, time-related well production data including measured static downhole pressure data, time-related injection well data including measured wellhead pressure and injection rate data, geological information and fluid characterization information and other reservoir production records and parameters for use in reservoir simulation, as will be described below.

The CPU computer 40 of data processing system P includes a processor 54 and an internal memory 56 coupled to the processor 54 to store operating instructions, control information and to serve as storage or transfer buffers as required. The data processing system P includes program code 58 stored in memory 56 of the CPU or CPU's 40. The program code 58, according to the present invention, is in the form of computer operable instructions causing the CPU's 40 transfer data back and forth for processing by a number of graphical processing units or GPU's 60 to simulate fluid motion in the reservoir, as will be set forth.

It should be noted that program code 58 may be in the form of microcode, programs, routines, or symbolic computer operable languages that provide a specific set of ordered operations that control the functioning of the data processing system P and direct its operation. The instructions of program code 58 may be stored in non-transitory tangible computer readable form in memory 56 or in such form on computer diskette, magnetic tape, conventional hard disk drive, electronic read-only memory, optical storage device, or other appropriate data storage device having a computer usable medium stored thereon. Program code 58 may also be contained on a data storage device as a computer readable medium.

The graphical units or GPU's 60 are general purpose, programmable graphical processing units, often also referred to as GPU's. The GPU's 60 are programmed to determine unknowns, using a linearized system of equations for the individual cells, as will be set forth. It should also be understood that in some instances, processor nodes other than GPU's may be used as processor nodes in the data processing system D, if desired.

Although the present invention is independent of the specific computer hardware used, one embodiment of the present invention is based on a suitable number of quad-core CPU's and multi-core GPU's. The CPU's 40 used in an example embodiment of the system are in the form of Intel quad-core Nehalem processors or Intel six-core Westmere processors, and the GPU 14's are in the example embodiment preferably 440-core NVidia Fermi M2070Q or 512-core NVidia Fermi QuadroPlex 7000 GPU's. It should be understood, however, that other computer hardware may also be used, as will be set forth below.

The present invention utilizes a dual-tier approach to acceleration via the GPU's 60 which deliver nearly an order-of-magnitude speed improvement over earlier methods. The present invention accomplishes reservoir simulation in a heterogeneous (hybrid) computer environment including both CPU's 40 and GPU's 60. The present invention thus provides a computer-based system for linear systems for fine grid reservoir simulation of giant subsurface reservoirs.

The acceleration of the linearized equation system processing sequence of the reservoir simulation process obtained in the present invention can have a substantial impact in saving computer time, reducing costs and also allowing more reservoir studies to be carried out within given time constraints. As will be set forth, processing times have achieved a speed up by a factor of three in some instances. Acceleration of the computations in the present invention enables much faster determinations than previously possible, so that the reservoir simulator can keep pace with real-time data acquisition of field measurements.

Figure 4B:
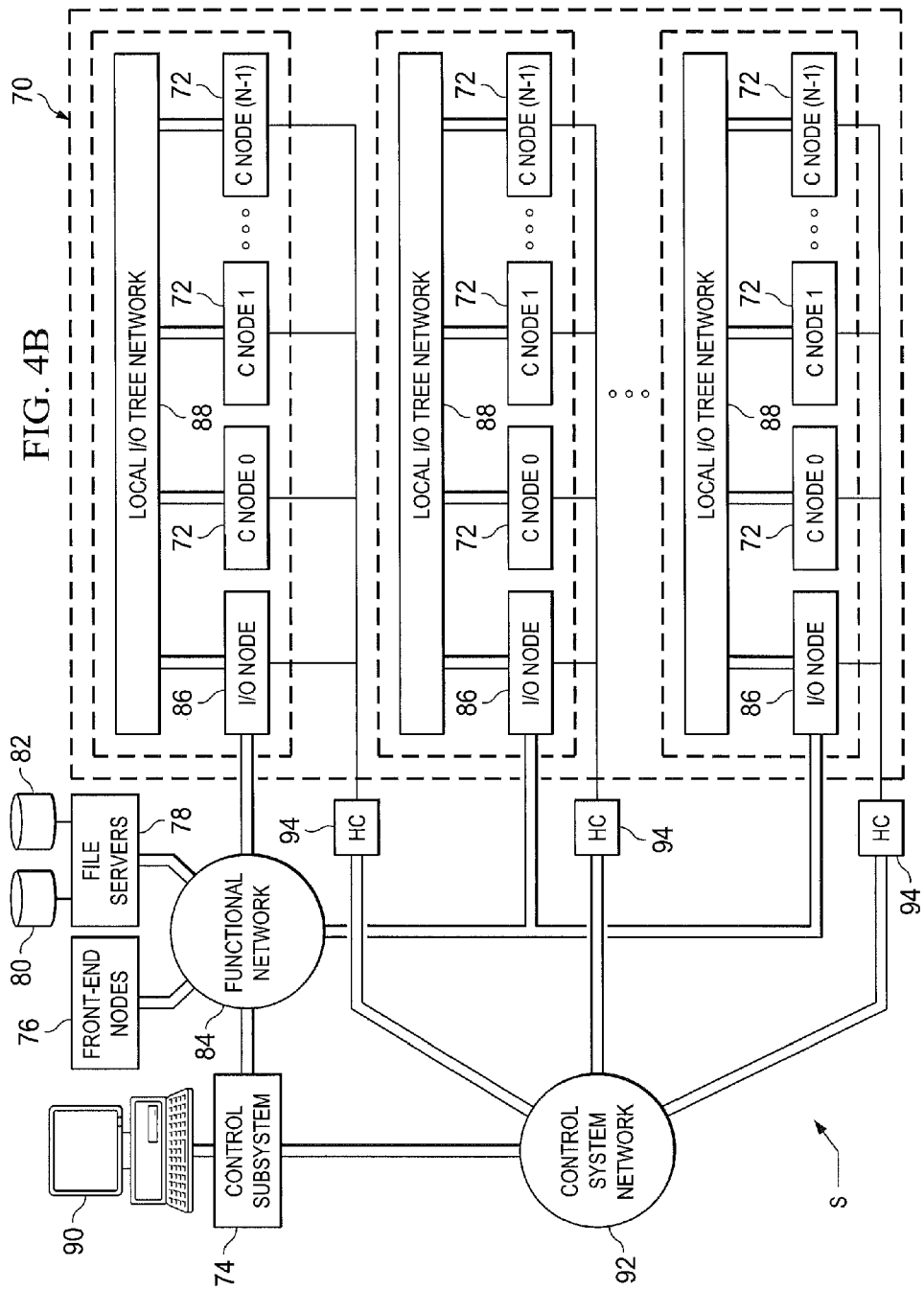
FIG. 4B is a schematic diagram of a petascale computer system organized for reservoir simulation according to the present invention.

In FIG. 4B, a massively parallel computer or data processing system S capable of petascale computations, such as the IBM Blue-Gene/P is illustrated schematically. Further details of such a computer system are set forth, for example, in U.S. Pat. No. 7,680,048.

Computer system D comprises a compute core 70 having a large number of compute nodes 72 logically arranged for inter-nodal communication in a regular array or lattice, which collectively perform the bulk of the processing. The operation of computer system S and compute core 70 is generally controlled by a control subsystem 74. Various additional processors contained in front-end nodes 76 perform certain auxiliary data processing functions, and file servers 78 provide an interface to data storage devices such as rotating magnetic disk drives 80 and 82, or other input/output (I/O) sources. A functional network 84 provides the primary data communications path among the compute core 70 and other system components. For example, data stored in storage devices attached to file servers 78 is loaded and stored to other system components through functional network 84.

Compute core 70 comprises a number of input/output (I/O) nodes 86 and compute nodes 72. The compute nodes 72 perform the computationally intensive reservoir simulation processing according to the present invention which requires a large number of processes proceeding in parallel. Each I/O node 86 handles I/O operations for a respective set of N compute nodes 72. Compute core 70 contains M sets of I/O nodes 86 and their associated sets of compute nodes, so that compute core 70 contains a total of M times N compute nodes 72. The number of compute nodes in compute core 70 can be very large. For example, in one implementation M=1024 (1K) and N=64, for a total of 64 K compute nodes.

In general, application programming code and other data input required by the compute core for executing user application processes, as well as data output produced by the compute core as a result of executing user application processes, is communicated externally of the compute core over functional network 84. The compute nodes 72 within a set communicate with the corresponding I/O node 86 over a corresponding local I/O tree network 88. The I/O nodes 86 in turn are attached to functional network 84, over which they communicate with I/O devices attached to file servers 78, or with other system components. Functional network 84 thus handles all the I/O for the compute nodes, and requires a very large bandwidth. Functional network 84 may be a set of gigabit Ethernet interfaces to multiple Ethernet switches. The local I/O tree networks 88 may be viewed logically as extensions of functional network 84, since I/O operations proceed through both networks, although they are physically separated from functional network 84 and observe different protocols.

Control subsystem 74 directs the operation of the compute nodes 72 in compute core 70. Control subsystem 74 is preferably a mini-computer system including its own processor or processors, internal memory, and local storage, and having an attached console 90 for interfacing with a system administrator or similar person.

Control subsystem 74 also includes an internal database which maintains certain state information for the compute nodes in compute core 70, and various control and/or maintenance applications which execute on the processors of the control subsystem 74, and which control the allocation of hardware in compute core 70, direct the pre-loading of data to the compute nodes, and perform certain diagnostic and maintenance functions. Control subsystem 74 communicates control and state information with the nodes of compute core 70 over control system network 92. Network 92 is coupled to a set of hardware controllers 94 which communicate with the nodes of an associated set of compute nodes 72 and their respective I/O node 86 over a corresponding local hardware control network. The hardware controllers 94 and local hardware control networks may be considered logically as extensions of control system network 92, although they are physically separate. The control system network and local hardware control network operate at significantly lower data rates than the functional network 84.

In addition to control subsystem 74, front-end nodes 76 comprise a collection of processors and memories which perform certain auxiliary functions which, for reasons of efficiency or otherwise, are best performed outside the compute core. Functions which involve substantial I/O operations are generally performed in the front-end nodes. For example, interactive data input, application code editing, or other user interface functions are generally handled by front-end nodes 76, as is application code compilation. Front-end nodes 76 are coupled to functional network 84 for communication with file servers 78, and may include or be coupled to interactive workstations. As noted above, further details of the Blue-Gene® processor P are set forth in U.S. Pat. No. 7,680,048, which is incorporated herein by reference.

Because petascale computation, as well as exascale computation in the future, is likely to employ heterogeneous architectures with many CPUs, but also possibly many accelerator devices (GPUs or Many-Integrated-Core chips), the underlying linear solution methodology chosen for both the coarse and fine grid solutions has been optimized according to the present invention. The optimization provides for minimal communication and data transfer between different hardware components at both the preconditioning and conjugate-gradient accelerator stages, as will be set forth below. The multi-scale approach according to the present invention benefits, therefore, from one single processing framework that is highly efficient on whichever hardware configuration is applied.

A flowchart F (FIG. 5) indicates the basic computer processing sequence of reservoir simulation incorporating the methodology of the present invention and the computational sequence taking place during application of a typical embodiment of the present invention.

Read Geological Model, (Step 100): Simulation according to the present invention begins by reading the geological model as input and the time-invariant data. The geological model read in during step 40 takes the form of binary data containing one value per grid cell of each reservoir model property. These properties include the following: rock permeability tensor; rock porosity, individual cell dimensions in the x, y and z directions; top depth of each cell; and x-y-z location of each existing fluid contacts (gas-oil-contact, gas-water-contact, and oil-water-contact, as applicable).

Time-invariant data read in during step 100 include the fluid characterization composition and thermodynamic properties of each component (critical temperature, critical pressure, critical volume, accentric factor, molecular weight, parachor, shift parameter and binary interaction coefficients). The time-invariant data also includes fluid relative permeability tables that provide a value of relative permeability for a given fluid saturation for the reservoir rock in question, and reservoir temperature since the present model is isothermal.

Discretize Model (Step 102): Calculation of rock transmissibilities for each cell based on the linking permeability and cell geometry is performed for every cell and stored in memory. There are a number of such models for transmissibility calculation to those familiar with the art depending on the input data (such as block-face or block-center permeability). In addition, the pore volume of every cell is computed and stored in memory.

Initialize Reservoir (Step 104): Before simulation takes place, the initial distribution of the fluids in the reservoir must be computed. This process involves iteration for the pressure at every cell. The pressure at every point is equal to a "datum" pressure plus the hydrostatic head of fluid above it. Since hydrostatic head at a cell depends on the densities of the column of fluid above it, and density itself depends on pressure and fluid composition via an equation of state (or EOS, described below), the solution is iterative in nature. At each cell, the computed pressure is used to compute a new density, from which a new hydrostatic head and cell pressure is recomputed. When the pressure iterated in this fashion does not change any further, the system has equilibrated and the reservoir is said to be "initialized."

Read and Organize Data (Step 106): Recurrent data read in during step 106 is time-varying data and, as such, it must be read at every time step during the simulation. It includes the oil, gas and water rates of each well that have been observed during the "history" period of the simulation (the period of known field production data that is used to calibrate the simulator). It also includes production policies that are to be prescribed during the "prediction" phase (the period of field production that the simulator is expected to forecast). Production policy data include data such as rates required from each well or group of wells and constraints that should be imposed on the simulation (such as maximum gas-oil ratios, minimum bottom-hole-pressure allowed per well, etc.). This data can change over periods of time based on actual field measurements during the "history" phase, or based on desired throughput during the "prediction" phase.

With the present invention, the main strategy for time savings is generation of an inexpensive good initial estimate or guess for the fine cell parameter values. In addition, when heterogeneous systems are used as the computational architecture, an added acceleration benefit is provided from the reduced communication requirements of the underlying iterative processing.

Figure 5:
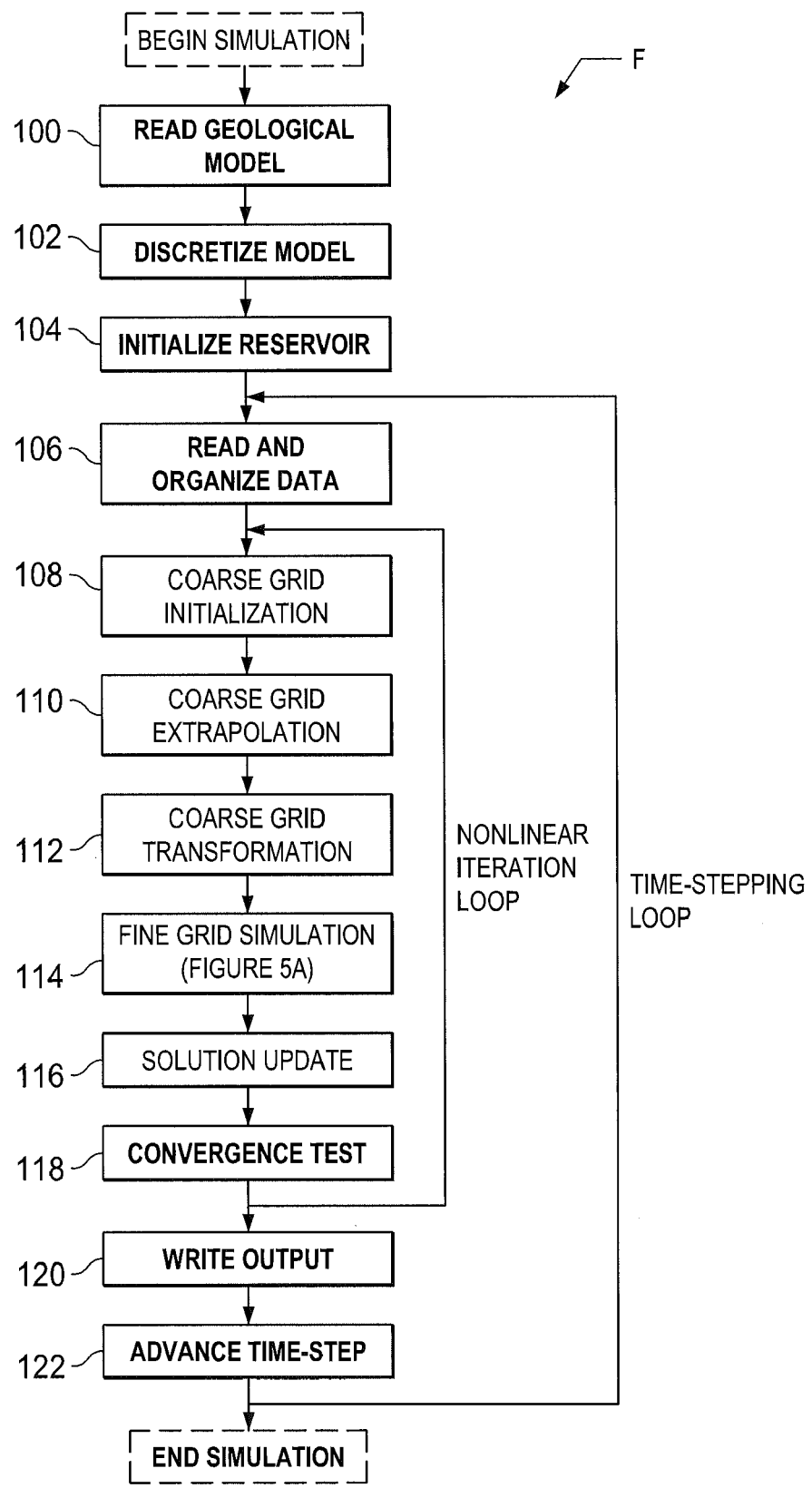
FIG. 5 is a functional block diagram of a set of data processing steps performed in the computer system of FIGS. 4A and 4B during computerized reservoir simulation of a subterranean reservoir according to the present invention.
Figure 6:
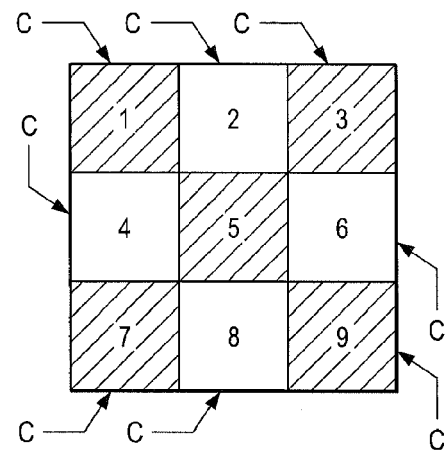
FIG. 6 is a schematic diagram of a two-dimensional ordering of portions of a grid of adjacent cells of the reservoir of FIG. 1.

Consider FIG. 6 which illustrates a simple natural ordering of adjacent cells C of the reservoir in a grid, drawn in two-dimensions only, for simplicity. This grouping of cells for the reservoir is indicated schematically at step 106 of FIG. 5. The cells C are assembled in two distinct groups (1 indicated as cross-hatched and 2 as indicated as blank) in a checkerboard pattern. The unknowns for the blank cells in group 2 are to be identified with even numbered subscripts and the cross-hatched cells of group 1 with odd numbered subscripts. The group or ordering of cells in the manner shown in FIG. 6 during step 106 results in a finite-difference stencil composed of five connections (east "e", west "w", north "n", south "s" and center-diagonal "d"). The grouping or organization of alternate ones of the reservoir cells into two distinct groups in this manner generates a matrix structure which is then reordered or assembled during step 106 (FIG. 5) as illustrated schematically in the matrix structure shown in FIG. 7.

Figure 7:
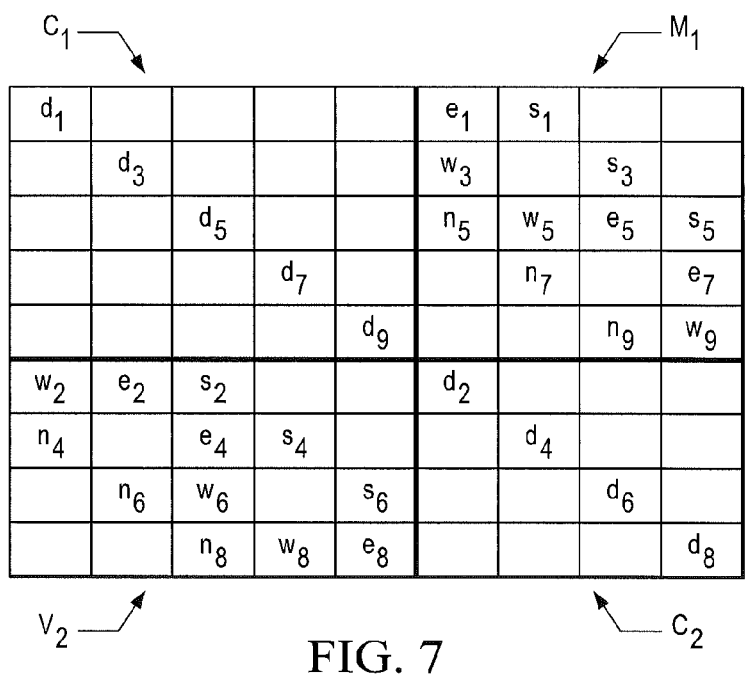
FIG. 7 is a schematic diagram of structure of the algebraic matrix of a restructured two-dimensional ordering according to the present invention of portions of a grid of adjacent cells of the reservoir of FIG. 1.

It is to be noted that the matrix structure of FIG. 7, assembled in reordered form in four different quadrants, groups the odd-numbered unknowns in the upper part of the matrix and the even-numbered unknowns in the lower part of the matrix. A novel variant is used that, by re-arranging the order of computations for hybrid computer hardware, enables optimization of solution processing for a CPU-GPU environment, not only with the aim of minimizing the communication traffic between CPU and GPU but also being mindful of the current memory limitations on the GPU's. The procedure cuts in half both this traffic and the GPU memory requirements during hybrid GPU-CPU computation, and is an important feature of the present invention.

The matrix fill is sparse, so only the labeled entries need be stored in memory. For notational convenience, the upper left quadrant of odd-numbered diagonal terms in FIG. 7 is labeled as $C_1$, the upper right quadrant of odd-numbered west-east-north-south terms as $M_1$, the lower left quadrant of even-numbered west-east-north-south terms as $V_2$ and the lower right quadrant of even-numbered diagonal terms as $C_2$.

Figures 8, 9:
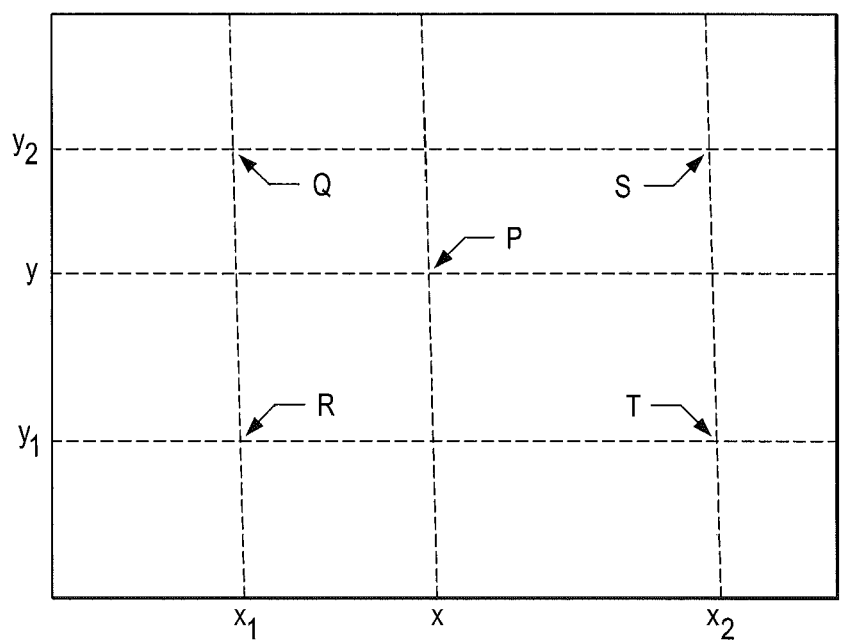
FIG. 8 is a schematic two-dimensional diagram (structure of the algebraic matrix) of a three-dimensional ordering according to the present invention of portions of a grid of adjacent cells of the reservoir of FIG. 1.
FIG. 9 is a schematic diagram of an example of reservoir model grids for applying interpolation of a multi-level solution according to the present invention.

Extension to a three dimensional grid is straightforward in that two new entries appear in the matrix: the "above" and "below" connections which are adjacent to the diagonal terms in the $C_1$ and $C_2$ matrices. In other words, the three dimensional grid transforms those diagonal matrices into tri-diagonal form as illustrated in FIG. 8.

It should be noted, however, that gridded geological models at the seismic-scale may include, in many cases, faults and pinch-outs that will not conform to the regular set of connections outlined here and these will be inserted in the model from geological interpretations even if they are not visible in the seismic data. Those additional connections would have to be handled accordingly and, in the present embodiment, would have to be carried in the right-hand-side of the linear system (in order to preserve the same sparse structure). Depending on the magnitude of the connection terms, the present invention performs as required if the connections are weak. However, convergence may be a problem for cases where the connection is strong, requiring either more iterations or a stronger preconditioner.

It will be seen in the description that follows that assembly by ordering and reordering of the unknowns in the manner described as indicated schematically at step 106 (FIG. 5)

succeeds in providing a linear solution that can be processed in two parts treating roughly half of the unknowns every time. This is advantageous for the GPU for two reasons: the amount of data transfer from the CPU to the GPU is cut in half and the amount of data residing in GPU memory (which is smaller than that of CPU's) is also cut in half. In homogeneous computer systems this merely translates into a saving of CPU memory in work arrays during these operations, so that larger models can be handled.

After re-ordering of the cells into two subgroups (which are labeled 1 and 2, as noted), matrix A has the form:

$$A = \begin{bmatrix} C_1 & M_1 \\ V_2 & C_2 \end{bmatrix} \quad (1)$$

so that the original system of matrix equations to be solved by processing is:

$$\begin{bmatrix} C_1 & M_1 \\ V_2 & C_2 \end{bmatrix} \begin{bmatrix} x_1 \\ x_2 \end{bmatrix} = \begin{bmatrix} R_1 \\ R_2 \end{bmatrix} \quad (2)$$

Initialization

Coarse Grid Initialization (Step 108): Processing with the methodology on the data organized as a result of step 106 takes place and begins with an initialization step 108, during which an initial estimate during for all cells in group 1 of the matrix of FIG. 6 is set to zero:

$$x_1 = 0 \quad (3)$$

The initial estimate for all cells in group 2 is determined during step 108 in a manner so that group 2 residuals are always zero. This precludes the need to update the group 2 residuals in the GPU and reduces the dimensionality of the GPU burden by roughly half. Mathematically, this is accomplished by the following manipulations of the original system. Linear equation residuals are given by:

$$\begin{bmatrix} \rho_1 \\ \rho_2 \end{bmatrix} = \begin{bmatrix} R_1 \\ R_2 \end{bmatrix} - \begin{bmatrix} C_1 & M_1 \\ V_2 & C_2 \end{bmatrix} \begin{bmatrix} x_1 \\ x_2 \end{bmatrix} \quad (4)$$

Setting group 2 residuals to zero:

$$\rho_2 = R_2 - V_2 x_1 - C_2 x_2 = 0 \quad (5)$$

Given that $x_1 = 0$, an initial estimate can be generated during step 108 for $x_2$ as follows:

$$x_2 = C_2^{-1} R_2 \quad (6)$$

This implies solution of a tridiagonal system of cells of group 2. It is to be noted that no group 1 cells need to be transferred to the GPU's for such processing.

The initial residuals for the cells of group 1 are computed during step 108 from equation (4) above (remembering that $x_1 = 0$):

$$\rho_2 = R_1 - M_1 x_2 \quad (7)$$

Conjugate-Gradient Extrapolation

Coarse Grid Extrapolation (Step 110): During step 110, a preconditioned conjugate-gradient extrapolation is performed on the initialized data resulting from step 108. During step 110, a preconditioner Q is selected and used during the conjugate gradient extrapolation to improve the condition number of the original matrix A.

Once a preconditioner is selected, the matrix-vector product $AQ^{-1}v = Pv$ is required for any conjugate-gradient method. The selected preconditioner Q used in the processing techniques according to the present invention is what is known in the art as a "right" preconditioner in the sense that it preconditions matrix A "from the right" and therefore does not change the value of the original system residual or right-hand side, as can be seen below:

$$Ax = R \quad (8)$$

$$AQ^{-1}Qx = R \quad (9)$$

Therefore, making $P = AQ^{-1}$ and $y = Qx$, the system of matrix equations becomes:

$$Py = R \quad (10)$$

It is to be noted that this implies that, after solving the system for unknowns "y" via conjugate-gradient acceleration, the true solutions "x" are obtained by the inverse transformation:

$$x = Q^{-1} y \quad (11)$$

Q is chosen for the process according to the present invention to be a Z-line preconditioner of the Gauss-Seidel type. The terminology "Z-line" arises because the main diagonal sub-matrices $C_1$ and $C_2$ (FIGS. 6 and 7) contain the vertical columns of the 3D reservoir grid (i.e. the Z-direction of the reservoir grid):

$$Q = \begin{bmatrix} C_1 & 0 \\ V_2 & C_2 \end{bmatrix} \quad (12)$$

It is also to be noted here that $A = Q + M_1$ if Equation (12) is compared with Equation (1) above. Therefore, the following equalities hold:

$$Pv = AQ^{-1}v = (Q + M_1)Q^{-1}v = v + M_1 Q^{-1} v$$

Or, in full matrix notation:

$$Pv = \begin{bmatrix} v_1 \\ v_2 \end{bmatrix} + \begin{bmatrix} 0 & M_1 \\ 0 & 0 \end{bmatrix} \begin{bmatrix} C_1 & 0 \\ V_2 & C_2 \end{bmatrix}^{-1} \begin{bmatrix} v_1 \\ v_2 \end{bmatrix} \quad (13)$$

Since according to the present invention the residuals for the cells of group 2 are always zero:

$$Pv = \begin{bmatrix} v_1 \\ 0 \end{bmatrix} + \begin{bmatrix} 0 & M_1 \\ 0 & 0 \end{bmatrix} \begin{bmatrix} C_1 & 0 \\ V_2 & C_2 \end{bmatrix}^{-1} \begin{bmatrix} v_1 \\ 0 \end{bmatrix} \quad (14)$$

a matrix-vector multiplication which reduces to:

$$Pv = \begin{bmatrix} v_1 \\ 0 \end{bmatrix} \begin{bmatrix} 0 & M_1 \\ 0 & 0 \end{bmatrix} \begin{bmatrix} \delta_1 \\ \delta_2 \end{bmatrix} \quad (15)$$

where:

$$\begin{bmatrix} C_1 & 0 \\ V_2 & C_2 \end{bmatrix} \begin{bmatrix} \delta_1 \\ \delta_2 \end{bmatrix} = \begin{bmatrix} v_1 \\ 0 \end{bmatrix} \quad (16)$$

This system is easily solved for $\delta_1$ and $\delta_2$ in two steps by multiplying out the terms in equation (16):

$$\delta_2 C_1^{-1} v_1 \quad (17)$$

$$\delta_2 = -C_2^{-1} V_2 \delta_1 \quad (18)$$

Equation (18) is implemented so that the matrix-vector product $V_2 \delta_1$ is computed first and then the tridiagonal system is solved for $\delta_2$.

The preconditioned matrix-vector product is obtained which can be expressed by:

$$Pv = \begin{bmatrix} v_1 \\ 0 \end{bmatrix} + \begin{bmatrix} M_1 \delta_2 \\ 0 \end{bmatrix} = \begin{bmatrix} v_1 + M_1 \delta_2 \\ 0 \end{bmatrix} \quad (19)$$

Once the preconditioned matrix-vector product Pv is determined, the conjugate-gradient acceleration may be performed during step 110 (FIG. 5) using any of the three acceleration algorithms described below (ORTHOMIN, BiCGSTAB and TFQMR). As has been described above, the choice of accelerator impacts GPU performance and bi-conjugate Lanczos methods have a clear memory advantage over traditional Krylov methods in that Krylov methods must store multiple orthogonal direction vectors in order to provide robust performance. This additional storage is impractical considering GPU memory limitations of heterogeneous data processing systems, but is easily accommodated by the homogeneous CPU-based system S where memory is plentiful and there are no host-to-device communication costs.

Orthogonal Minimization Conjugate Gradient Methodology (ORTHOMIN(K))

The computational steps for this methodology are as follows:

1) Compute initial residual:

$r_0 = b - Ax_0$

2) Set initial direcion vector:

$p_0 = r_0$

3) For iteration $k = 0, 1, 2, \ldots$, until convergence, Do:

4) $\alpha_k = \dfrac{(r_k, Ap_k)}{(Ap_k, Ap_k)}$

5) $x_{k+1} = x_k + \alpha_k p_k$

6) $r_{k+1} = r_k - \alpha_k Ap_k$

7) $\beta_{ik} = -\dfrac{(Ar_{k+1}, Ap_i)}{(Ap_i, Ap_i)}$, for $i = j - K + 1, \ldots, k$ 8) $p_{k+1} = r_{k+1} + \sum_{i=k-K+1}^{k} \beta_{ik} p_i$ 9) End Do Note that K is the number of orthogonal directions that are stored in memory for re-use during the iterations. This storage is usually practical on CPUs but seldom affordable in GPU architectures due to their current limited total memory. For this reason, ORTHOMIN is preferred for embodiments of this invention on homogeneous architectures (CPU-only) but not for heterogeneous (CPU+GPU) embodiments of this invention.

The convergence criterion is measured by the value of the L2-norm of the residual (r). Typically, when this norm is less than a prescribed tolerance (0.01 or lower) the process has converged. In models with the present invention, the norm of the relative residual value (current residual divided by initial residual) is checked against a prescribed tolerance to avoid that very large or very small values on the initial residual bias the number of iterations required for convergence, i.e.:

$$\left\| \dfrac{r_{k+1}}{r_0} \right\| < \epsilon$$

Bi-Conjugate Gradient Stabilized Methodology (BiCGSTAB)

The computational steps for this methodology are as follows:

1) Compute initial residual:

$r_0 = b - Ax_0$

2) Set initial direcion vector:

$p_0 = r_0$

3) For iteration $k = 0, 1, 2, \ldots$, until convergence, Do:

4) $\alpha_k = \dfrac{(r_k, r_0^*)}{(Ap_k, r_0^*)}$

5) $s_k = r_k - \alpha_k Ap_k$

6) $w_k = \dfrac{(As_k, s_k)}{(As_k, As_k)}$

7) $x_{k+1} = x_k + \alpha_k p_k + w_k s_k$

8) $r_{k+1} = s_k - w_k As_k$

9) $\beta_k = \dfrac{(r_{k+1}, r_o^*)}{(r_k, r_o^*)} \times \dfrac{\alpha_k}{w_k}$ 10) $p_{k+1} = r_{k+1} + \beta_k (p_k - w_k Ap_k)$ 11) End Do The convergence criterion is measured by the value of the L2-norm of the residual (r). Typically, when this norm is less than a prescribed tolerance (0.01 or lower) the process has converged. In models, with the present invention, the norm of the relative residual value (current residual divided by initial residual) is checked against a prescribed tolerance to avoid that very large or very small values on the initial residual bias the number of iterations required for convergence, i.e.:

$$\left\| \dfrac{r_{k+1}}{r_0} \right\| < \epsilon$$

Transpose-Free Quasi-Minimum Residual Methodology (TFQMR)

The computational steps for this technique of conjugate-gradient acceleration are as follows:

1) Compute initial residual and initialize variable:

$r_0 = b - Ax_0$ $w_0 = u_0 = r_0$ $v_0 = Au_0$ $d_0 = \theta_0 = \sigma_0 = 0$

2) Compute initial error norm:

$\tau_0 = \|r_0\|$

3) For iteration $k = 0, 1, 2, \ldots$, until convergence, Do:

4) If $k$ is even, compute:

$\alpha_{k+1} = \alpha_k = \dfrac{\rho_k}{(v_k, r_o^*)}$ $u_{k+1} = u_k - \alpha_k v_k$ 5) $w_{k+1} = w_k - \alpha_k Au_k$ 6) $d_{k+1} = u_k + \dfrac{\theta_k^2}{\alpha_k} \sigma_k d_k$ 7) $\theta_{k+1} = \dfrac{\|w_{k+1}\|}{\tau_k}$ 8) $c_{k+1} = (1 + \theta_{k+1}^2)^{-1/2}$ 9) $\tau_{k+1} = \tau_k \theta_{k+1} c_{k+1}$ 10) $\sigma_{k+1} = c_{k+1}^2 \alpha_k$ 11) $x_{k+1} = x_k + \sigma_{k+1} d_{k+1}$ 12) If $k$ is odd, compute:

$\rho_{k+1} = (w_{k+1}, r_0^*)$ $\beta_{k-1} = \dfrac{\rho_{k+1}}{\rho_{k-1}}$ $u_{k+1} = w_{k+1} + \beta_{k-1} u_k$ $v_{k+1} = Au_{k+1} + \beta_{k-1}(Au_k + \beta_{k-1} v_{k-1})$ 13) End Do The convergence criterion is again measured by the value of the L2-norm of the residual (r). Typically, when this norm is less than a prescribed tolerance (0.01 or lower) the process has converged. In models with the present invention, the norm of the relative residual value (current residual divided by initial residual) is checked against a prescribed tolerance to avoid that very large or very small values on the initial residual bias the number of iterations required for convergence, i.e.:

$$\left\| \dfrac{r_{k+1}}{r_0} \right\| < \epsilon$$

Selection of the conjugate gradient accelerator can be of great importance in heterogeneous embodiments of the invention of the type shown in FIG. 4A, with CPU's and GPU's, of the type described in commonly owned U.S. patent application Ser. No. 13/023,076, filed Feb. 8, 2011, and of which Applicant is a named inventor. The type of conjugate gradient accelerator selected is of somewhat less relevance in homogenous computers of the type shown in FIG. 4B, such as the IBM Blue-Gene/P.

In general, the Orthomin accelerator provides a very suitable and robust acceleration for homogenous (CPU-based) environments, but suffers from the need to transfer multiple orthogonal directions between CPU and GPU in heterogeneous environments. For this reason, it is typical with the present invention to use other conjugate gradient variants for heterogeneous environments, such as the BiCGSTAB (Bi-Conjugate Gradient Stabilized Methodology) and TFQMR (Transpose-Free Quasi-Minimum Residual Methodology) described above.

Transform Solutions to Those of the Original System

Coarse Grid Transformation (Step 112): As indicated previously, the conjugate-gradient extrapolation process during step 110 produces the solution "y" of the system P y=R (Equation 10) where P=A Q$^{-1}$ and y=Q x. Processing according to FIG. 5 by the CPU is then performed during step 112 to transform the solutions to those of the original system. In such processing, x=Q$^{-1}$ y is obtained as indicated by tridiagonal solution of the system Q x=y or, in matrix notation:

$$\begin{bmatrix} C_1 & 0 \\ V_2 & C_2 \end{bmatrix} \begin{bmatrix} x_1 \\ x_2 \end{bmatrix} = \begin{bmatrix} y_1 \\ y_2 \end{bmatrix} \quad (20)$$

The first row of matrix Equation (20) yields:

$$x_1 = C_1^{-1} y_1 \quad (21)$$

So far, all computations have used group 1 unknowns and, therefore, relieved the GPU from transferring, storing and computing half of the total system of equations, resulting in 50% saving in time and computer memory required. It is to be noted, however, that this implies that y$_2$ is not available because there are no residuals to update for group 2 cells, as these were guaranteed to be zero by the way the process was initialized. In order to solve for x$_2$, the second row of the original system (2) can be expanded as:

$$V_2 x_1 + C_2 x_2 = R_2 \quad (22)$$

and solved for x$_2$ as follows:

$$x_2 = C_2^{-1}(R_2 - V_2 x_1) \quad (23)$$

This only involves a tridiagonal solution for the group 2 cells so, once again, only half of the total system data needs to be transferred and processed by GPU's 60 of the data processing system D. For homogenous CPU-based systems, an advantage is provided in memory savings in work array storage since host-to device communication is not required.

Multi-Level Interpolation

FIG. 9 illustrates schematically a typical situation in the multi-level interpolation methodology of the present invention for transformation of the coarse grid solutions to the cells of the fine grid. In FIG. 9 where a value at point P(x,y) is to be interpolated from values defined at larger grid spacings on a coarser mesh (such as points Q, R, S and T). The present invention may be performed by three methods of interpolation which are set forth below.

Method 1-Bilinear Interpolation

A linear interpolation between points R and T gives:

$$f(x, y_1) = \frac{x_2 - x}{x_2 - x_1} f(x_1, y_1) + \frac{x - x_1}{x_2 - x_1} f(x_2, y_1)$$

Similarly, a linear interpolation between points Q and S gives:

$$f(x, y_2) = \frac{x_2 - x}{x_2 - x_1} f(x_1, y_2) + \frac{x - x_1}{x_2 - x_1} f(x_2, y_2)$$

Interpolating for the desired location P(x,y):

$$f(x, y) = \frac{y_2 - y}{y_2 - y_1} f(x, y_1) + \frac{y - y_1}{y_2 - y_1} f(x, y_2)$$

where $f(x,y_1)$ and $f(x,y_2)$ are given by the first two expressions above. It should be noted that this interpolation method is linear along lines parallel to either the x or the y direction but quadratic along any other straight line.

Method 2-Direct Injection

In some cases, it is sufficiently accurate to use the nearest point instead of performing the interpolation operations above in Method 1. In such a case $f(x,y)=f(x_1,y_2)$ is selected directly. Although this saves some computer time, in general the result is not as accurate. Direct injection can be advantageous, however, for geological models of mild heterogeneity.

Method 3-Four-Point Averaging

This method is a compromise in cost and accuracy between the previous two. A direct arithmetic average of the closest neighboring points is taken. In that case f(x,y) is selected:

$$f(x, y) = \frac{f(x_1, y_1) + f(x_2, y_1) + f(x_1, y_2) + f(x_2, y_2)}{4}$$

Further discussion on these and other interpolation approaches can be found elsewhere in the literature (for example, "A Review of Algebraic Multigrid," SCAI GMD Report No. 69, K. Stueben, November, 1999). Although Method 1 is quadratic along non-parallel lines as mentioned above (linear otherwise), its parallelization is highly efficient in multi-processor environments. Cubic methods (e.g. splines), although more accurate, generally do not compensate for the additional computational cost incurred and have not been considered here.

Figure 5A:
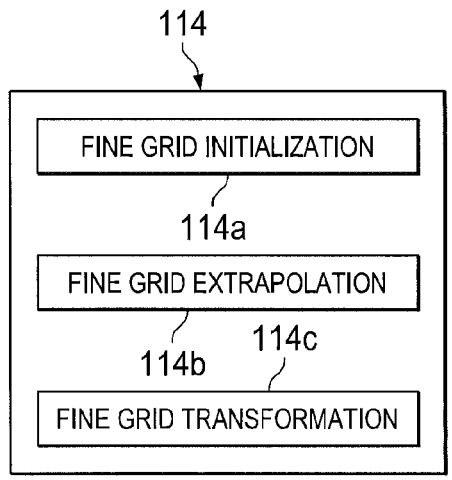
FIG. 5A is a functional block diagram of a portion of the data processing steps of FIG. 5.

Fine Grid Simulation (Step 114): During step 114, based on the initial estimate results of single phase flow obtained for the coarse grid during step 110 and transformed to the original fine grid model during step 112, a simulation of single phase flow for the reservoir during the time step of current interest is performed using the more accurate initial estimate. The reservoir simulation process then proceeds in the manner. The fine-grid solution during step 114 uses the same preconditioner and accelerator as the coarse-grid solution already described, as is presented in the patent application Ser. No. 13/023,076 "Seismic-scale Reservoir Simulation of Giant Subsurface Reservoirs using GPU-Accelerated Linear Equation Systems Calculations" of which Applicant is an inventor. As shown in FIG. 5A, the fine grid simulation during step 114 includes a fine-grid initialization step 114a, a fine-grid extrapolation step 114b and a fine-grid transformation step 114c for a 2-level solution. It should be noted that a 3-level solution would have two sequences of coarse grid simulation each composed of the three step initialization, extrapolation and transfer motion, and one find grid simulation of the three described above.

Solution Update (Step 116): During step 116, the solution vector δx obtained during step 114 from solving the system of linear equations represents the updated solution vector s of Newton's method discussed above in the nonlinear iteration loop. Although this is, for the most part, what is known in the art as "Newton iteration", some checks to damp the solution vector take place in the present invention in order to improve the numerical stability of the simulation. As a result, the full "Newton step" is not always taken. A user-controlled parameter may be provided for the fluid motion variables of interest. This is, of course, reservoir model-dependent and overriding of these limits may be done by simulator engineers familiar with the reservoir or field being simulated Convergence Test (Step 118): The individual residuals of the linear equations resulting from step 116 are checked against user-prescribed tolerances. If these tolerances are satisfied, the nonlinear iteration loop is exited, solution output is written to file during step 120 for the current time step and the time step is advanced during step 122 to the next level.

If these tolerances are not satisfied, processing according to the nonlinear iteration loop returns to step 108 and continues. But if the number of nonlinear iterations becomes excessive, a decision is made to cut the time step size and repeat the entire nonlinear iteration loop again beginning at step 108 for the same time level. An excessive number of iterations is an indication that the solution has diverged and the changes may be too large to be adequately modeled with the time step previously chosen. A time-step cut is expected to not only reduce the magnitude of these changes but to also increase the diagonal dominance of the Jacobian matrix, which always has a beneficial effect on the convergence of the linear solver.

Write Output (Step 120): Measures of the determined fluid motion variables in the form of three-dimensional grids are written out in binary format as Disk I/O at the end of each time step. Also well information regarding other required data or measurements such as oil, gas, and water production rates per well, gas/oil ratio (GOR) per well and static well-head pressure (SWP) per well may be written out.

Advance Time-Step (Step 122): After the solution output data is written to file during step 120 for the current time step, the time step is advanced during step 122 to the next level and processing returns to step 106 for continued processing by the simulator.

Parallelization

Code parallelization follows the current standard high-performance computing (HPC) approach for multi-core architectures: using OpenMP shared-memory model for parallelization/multi-threading within each computer node while using MPI message-passing programming for parallelization between individual nodes.

In the context of homogeneous architectures (CPU-only), this is the typical setting of most PC clusters and supercomputers today. For instance, the IBM Blue-Gene/P supercomputer consists of 1024 nodes per rack, each node consisting of 4 computational cores. OpenMP is applied to multi-thread the code in these 4 cores while MPI is used to parallelize the code between individual nodes. Thus, a rack consisting of 1024 nodes (4096 cores) has 1024 MPI processes (or tasks) and 4 OpenMP threads per process.

It should be noted, however, that the computer code implemented by this invention can use any distribution of MPI/OpenMP resources. For instance, the aforementioned can also be run as 4096 MPI processes (or tasks) with 1 OpenMP thread per process (referred by some as a "virtual node", or VN, parallelization, since each core in the node acts as an individual MPI process). It can also be run as 2048 MPI processes (or tasks) with 2 OpenMP threads per process (referred by some as a "dual node", or DUAL, parallelization in which each node executes 2 tasks with 2 threads per task).

The most efficient mode for this invention has been found to be the first mode described above (1 process per node and 4 OpenMP threads, referred by some as "SMP node"). This is typical of very large models requiring thousands of cores to run: SMP mode is advantageous over VN mode and DUAL mode because it reduces the amount of overhead of having many thousands of MPI processes running at the same time. It is commonly considered that in petascale systems (and beyond to exascale), multi-core utilization as SMP (i.e. using OpenMP) is key to efficient utilization of these systems.

Figure 10:
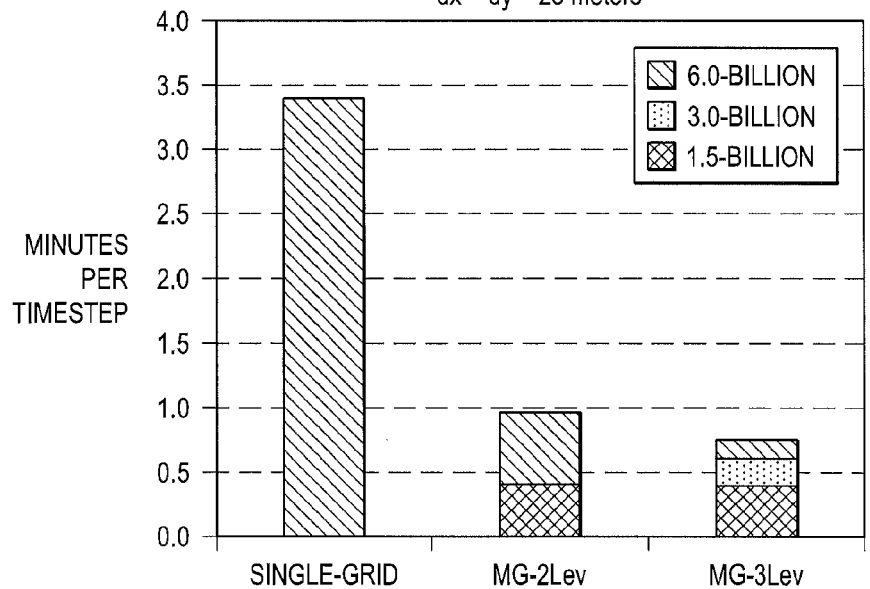
FIG. 10 is a comparative plot of processing minutes per time step for conventional single grid solution processing, and for multi-level solution according to the present invention for a fine grid of a first size such as 25-meter seismic-scale.

FIG. 10 illustrates results from a 6-billion cell model reservoir simulator for an existing reservoir containing single phase fluid above its bubble point pressure (3 unknowns per cell, i.e., black-oil type) on an IBM Blue Gene/P supercomputer using 24,576 cores. Grid size is seismic-scale (25 meter). A conventional single-grid solution solved the system directly on a fine grid and runs at an average of 3.4 minutes per time step.

A 2-level approach solved a 1.5-billion-cell linear system ($dx=dy=50$ meter) first to generate an initial guess, interpolated such initial guess onto a 6-billion-cell grid ($dx=dy=25$ meter) and used this grid-refined initial guess to solve the fine-grid linear system. This 2-level approach took 0.96 minutes per time-step, resulting in an overall speedup of 3.54 times.

A 3-level approach solved a 1.5-billion-cell linear ($dx=dy=50$ meter) system first to feed this solution as initial guess to a 3-billion-cell linear system which, in turn, was fed to a 6-billion-cell linear system ($dx=dy=25$ meter). This 3-level approach took 0.74 minutes per time step, resulting in an overall speedup of 4.59 times. One can note in FIG. 10 that the individual contributions to total time for this 3-level approach, indicating that the amount of time taken by the more expensive fine-grid iterations, has actually been minimized relative to the other two coarseness levels (1.5 billion and 3 billion).

Figure 11:
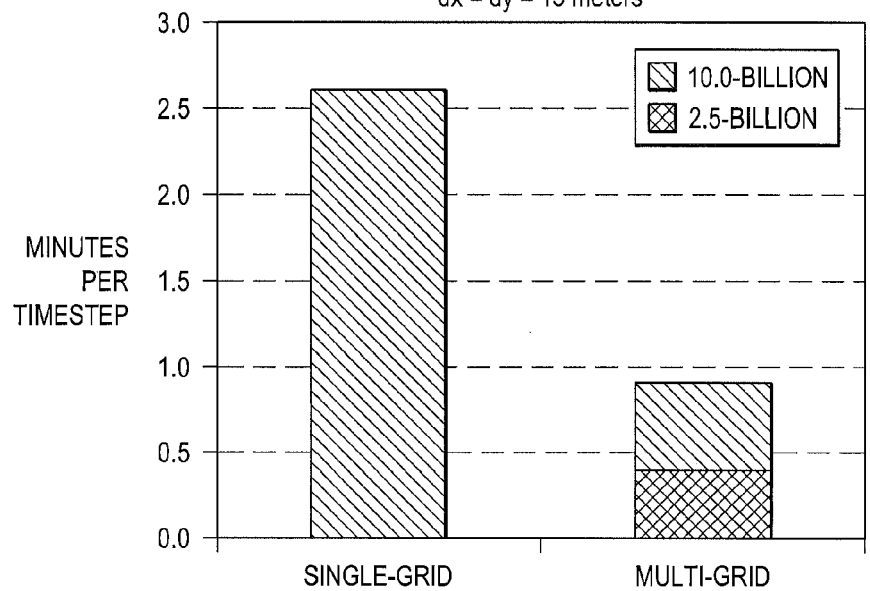
FIG. 11 is a comparative plot of processing minutes per time step for conventional single grid solution processing, and for multi-level solution according to the present invention for a fine grid of another smaller size (15-meter seismic-scale).

FIG. 11 illustrates results from a 10-billion-cell reservoir model of an actual reservoir run (with 3 unknowns per cell, i.e., black-oil type) on an IBM Blue-Gene/P supercomputer (using 49,152 cores). Grid size is $dx=dy=15$ meter. A conventional single-grid solution solved the system directly on a fine grid, running at an average of 2.6 minutes per time step.

A 2-level approach solved a 2.5-billion-cell linear system ($dx=dy=30$ meter) first to generate an initial guess, interpolated such initial guess onto a 10-billion-cell grid ($dx=dy=15$ meter) and used this grid-refined initial guess to solve the fine-grid linear system. This 2-level approach took 0.9 minutes per time-step, resulting in an overall speedup of 2.9 times. FIG. 12 is a black and white image of such a model. In actual practice, the temperature distribution indicate; by variations in color hue and intensity the distribution of temperature in the basin model.

FIG. 12 shows a present-day temperature distribution of an 11 billion cell temperature equation with kinetics from a prototype basin model run on 65,636 cores of an IBM Blue-Gene/P supercomputer with grid dimensions $dx=43$ meter, $dy=205$ meter and $dz=13$ meter using a 2-level solution. FIG. 12 is a black and white image of such a model. In actual practice, the temperature distribution indicates by variations in color hue and intensity, the distribution of temperature in the basin model.

Although different embodiments of this invention can be tuned for the specific cases in question, the general methodology is based on first, solving the coarse-grid problem to cost-effectively obtain an approximate solution using 2 levels of interpolation. The approximate solution then serves as an initial guess or estimate for the actual fine-grid problem. It should then be verified that few iterations on the fine-grid scale are required (e.g. less than 5). It may also be desirable to test with two and three levels of grid coarsening. If the processing time reduction from using three levels over two levels is substantial, additional levels may be tested.

It should be noted that the model formulations advocated in this embodiment use pressure and moles as the main unknowns and not fluid saturations. An example of molar formulation is set forth in commonly owned U.S. Pat. No. 7,526,418 "Highly-Parallel, Implicit. Compositional Reservoir Simulator for Multi-Million Cell Models"), which is incorporated herein by reference. Fluid saturation in particular can be very disadvantageous for multi-scale interpolations from fine to coarse grids since they can change drastically in value from a group of cells to the next. Although the subject patent cited above is for reservoir simulation, the same advantages and considerations apply to the temperature equation of the basin modeling.

From the foregoing, it can be seen that the present invention provides ways to accelerate specific portions of reservoir simulator computations by reducing the time spent in the expensive solution of linear systems of equations resulting from single phase fluid which can account for significant portion of the total simulation time. The advantages of the new approach increase in direct relation to the geological heterogeneity excluding faults, fractures and pinchout layers of the model and the refinement of the grid size. Specifically, the more heterogeneous the geology is and the finer the model grids are, the greater the advantage (in both computer time and methodology robustness) of a multi-level approach over single-level solutions.

The multi-level approach offered by the present invention forms an inexpensive but accurate initial estimate that can be used to advance the solution of the fine-grid problem without wasteful search of the solution space. The multi-level approach of the present invention provides fast interpolation/refinement of the solution between multiple scales on a parallel computer composed of possibly tens of thousands of computational cores.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined processing methodology, or in the utilization of the results thereof, requires the claimed matter in the following claims; such modifications shall be covered within the scope of the invention.

It should be noted and understood that there can be improvements and modifications made of the present inven-

What is claimed is:

1. A method of computerized simulation of a giant subsurface reservoir in a data processing system of a plurality of data processors, the computerized simulation being an iterative linear solution of equations for reservoir parameters of a giant subsurface reservoir, the giant subsurface reservoir being simulated as a model partitioned into a number of cells arranged in an organized system of cells, the simulation further being based on geological and fluid characterization information for the cells of the reservoir, the method comprising the computer processing steps of:
 (a) mapping information from the organized system of cells of the reservoir from an original fine grid scale into a coarse cell grid of a reduced number from the original grid;
 (b) initializing a postulated system solution matrix in the computer system for reservoir parameters for the coarse cell grid;
 (c) performing a preconditioned conjugate-gradient extrapolation in the computer system on the initialized postulated system solution matrix received for reservoir parameters for the coarse cell grid by determining a preconditioned matrix-vector product;
 (d) transforming in the computer system the results of the preconditioned conjugate-gradient extrapolation for the coarse cell grid to the original cell grid; and
 (e) performing an iterative linear solution in the computer system for reservoir parameters for the original grid of cells.

2. The method of claim 1, wherein the data processing system includes a display, and further including the step of forming an output display of the results of performing an iterative linear solution for reservoir parameters for the original grid of cells.

3. The method of claim 1, wherein the reservoir parameter comprises fluid flow in the cells of the reservoir.

4. The method of claim 1, wherein the reservoir parameter comprises single phase fluid flow in the cells of the reservoir.

5. The method of claim 1, wherein the computer processing step of processing in the computer system for preconditioned conjugate-gradient extrapolation reservoir parameters for the coarse cell grid comprises the step of forming an initial estimate of matrix values for a solution for a first set of alternately spaced cells in the reservoir.

6. The method of claim 5, further including the computer processing step of:
 determining an initial estimate for a second set of alternately spaced cells, which are adjacent the alternately spaced cells of the first set.

7. The method of claim 5, further including the computer processing step of:
 determining a residual matrix value for the first set of alternately spaced cells.

8. The method of claim 1, wherein the computer processing step of performing a preconditioned conjugate-gradient extrapolation comprises the step of forming a matrix preconditioner on the postulated system solution matrix for reservoir parameters for the coarse cell grid.

9. The method of claim 1, wherein the computer processing step of transforming in the processors the results of the preconditioned conjugate-gradient extrapolation comprises the steps of:
 performing a tridiagonal solution for the matrix values for a solution for the first set of alternately spaced coarse grid cells in the reservoir; and
 performing a tridiagonal solution for the matrix values for a solution for the second set of alternately spaced coarse grid cells in the reservoir.

10. The method of claim 1, wherein the step of performing an iterative linear solution for the original grid of cells comprises the computer processing steps of:
 initializing a postulated system solution matrix in the computer system for the original grid of cells; and
 performing a preconditioned conjugate-gradient extrapolation in the computer system on the initialized postulated system solution matrix received for reservoir parameters for the original grid of cells.

11. A data processing system for computerized simulation of a giant subsurface reservoir in a computer system, the computerized simulation being an iterative linear solution of equations for reservoir parameters of a giant subsurface reservoir, the giant subsurface reservoir being simulated as a model partitioned into a number of cells arranged in an organized system of cells, the simulation further being based on geological and fluid characterization information for the cells of the reservoir, the data processing system comprising:
 (a) a plurality of data processors, each performing in parallel the steps of:
  (1) mapping information from the organized system of cells of the reservoir from an original fine grid scale into a coarse cell grid of a reduced number from the original grid;
  (2) initializing a postulated system solution matrix in the computer system for reservoir parameters for the coarse cell grid;
  (3) performing a preconditioned conjugate-gradient extrapolation in the computer system on the initialized postulated system solution matrix received for reservoir parameters for the coarse cell grid by determining a preconditioned matrix-vector product;
  (4) transforming the results of the preconditioned conjugate-gradient extrapolation for the coarse cell grid to the original cell grid; and
  (5) performing an iterative linear solution in the computer system for reservoir parameters for the original grid of cells; and
 (b) a memory for storing the determined reservoir parameters of the original grid of cells.

12. The data processing system of claim 11, wherein the plurality of processors comprise a heterogeneous set of compute nodes.

13. The data processing system of claim 11, wherein the plurality of processors comprise a homogeneous set of compute nodes.

14. The data processing system of claim 11, wherein the data processing system further includes a display of forming an output image of reservoir parameters for the original grid of cells.

15. The data processing system of claim 11, wherein the reservoir parameter comprises fluid flow in the cells of the reservoir.

16. The data processing system of claim 11, wherein the reservoir parameter comprises single phase fluid flow in the cells of the reservoir.

17. The data processing system of claim 11, wherein the processors in performing the step of performing preconditioned conjugate-gradient extrapolation reservoir parameters for the coarse cell grid for reservoir parameters perform the step of forming an initial estimate of matrix values for a solution for a first set of alternately spaced cells in the reservoir.

18. The data processing system of claim 17, wherein the processors further perform the computer processing step of:
determining an initial estimate for a second set of alternately spaced cells, which are adjacent the alternately spaced cells of the first set.

19. The data processing system of claim 17, wherein the processors further perform the computer processing step of:
determining a residual matrix value for the first set of alternately spaced cells.

20. The data processing system of claim 11, wherein the processors in performing the step of performing a preconditioned conjugate-gradient extrapolation perform the step of forming a matrix preconditioner on the postulated system solution matrix for reservoir parameters for the coarse cell grid.

21. The data processing system of claim 11, wherein the processors in performing the step of transforming the results of the preconditioned conjugate-gradient extrapolation perform the step of:
performing a tridiagonal solution for the matrix values for a solution for the first set of alternately spaced coarse grid cells in the reservoir; and
performing a tridiagonal solution for the matrix values for a solution for the second set of alternately spaced coarse grid cells in the reservoir.

22. The data processing system of claim 11, wherein the processor in performing an iterative liner for reservoir parameters for the original grid of cells perform the computer processing steps of:
initializing a postulated system solution matrix in the computer system for the original grid of cells; and
performing a preconditioned conjugate-gradient extrapolation in the computer system on the initialized postulated system solution matrix received for reservoir parameters for the original grid of cells.

23. A data storage device having stored in a non-transitory computer readable medium computer operable instructions for causing a data processing system comprising a plurality of data processors, during computerized simulation computerized simulation of a giant subsurface reservoir of a giant subsurface reservoir, the giant subsurface reservoir being simulated as a model partitioned into a number of cells arranged in an organized system of cells, the simulation being by iterative linear solution of equations for reservoir parameters and further being based on geological and fluid characterization information for the cells of the reservoir, the computer operable instructions stored in the data storage device causing the data processing system to perform the following steps:
(a) mapping information from the organized system of cells of the reservoir from an original fine grid scale into a coarse cell grid of a reduced number from the original grid;
(b) initializing a postulated system solution matrix in the computer system for reservoir parameters for the coarse cell grid;
(c) performing a preconditioned conjugate-gradient extrapolation in the computer system on the initialized postulated system solution matrix received for reservoir parameters for the coarse cell grid by determining a preconditioned matrix-vector product;
(d) transforming in the computer system the results of the preconditioned conjugate-gradient extrapolation for the coarse cell grid to the original cell grid; and
(e) performing an iterative linear solution in the computer system for reservoir parameters for the original grid of cells.

24. The data storage device of claim 23, wherein the instructions for preconditioned conjugate-gradient extrapolation reservoir parameters for the coarse cell grid comprise instructions causing the processors to perform the computer processing step of:
forming an initial estimate of matrix values for a solution for a first set of alternately spaced cells in the reservoir.

25. The data storage device of claim 24, wherein the instructions further comprise instructions causing the processors to perform the computer processing step of:
determining an initial estimate for a second set of alternately spaced cells, which are adjacent the alternately spaced cells of the first set.

26. The data storage device of claim 24, wherein the instructions further comprise instructions causing the processors to perform the computer processing step of:
determining a residual matrix value for the first set of alternately spaced cells.

27. The data storage device of claim 24, wherein the instructions for performing a preconditioned conjugate-gradient extrapolation comprise instructions causing the processors to perform the computer processing step of:
forming a matrix preconditioner on the initialized system solution matrix.

28. The data storage device of claim 23, wherein the instructions for performing a preconditioned conjugate-gradient extrapolation comprises instructions causing the processors to form a matrix preconditioner on the postulated system solution matrix for reservoir parameters for the coarse cell grid.

29. The data storage device of claim 23, wherein the instructions for transforming in the processors the results of the preconditioned conjugate-gradient extrapolation comprise instructions causing the processors to perform the steps of:
performing a tridiagonal solution for the matrix values for a solution for the first set of alternately spaced coarse grid cells in the reservoir; and
performing a tridiagonal solution for the matrix values for a solution for the second set of alternately spaced coarse grid cells in the reservoir.

30. The data storage device of claim 23, wherein the instructions for performing an iterative linear solution for reservoir parameters for the original grid of cells comprise instructions causing the processors to perform the steps of:
initializing a postulated system solution matrix in the computer system for the original grid of cells; and
performing a preconditioned conjugate-gradient extrapolation in the computer system on the initialized postulated system solution matrix received for reservoir parameters for the original grid of cells.

* * * * *